United States Patent [19]

Chuang et al.

[11] 4,438,346
[45] Mar. 20, 1984

[54] REGULATED SUBSTRATE BIAS GENERATOR FOR RANDOM ACCESS MEMORY

[75] Inventors: Patrick T. Chuang, Cupertino; Paul D. Keswick, San Jose; Jeffrey L. Linden, Sr., Sunnyvale, all of Calif.

[73] Assignee: Advanced Micro Devices, Inc., Sunnyvale, Calif.

[21] Appl. No.: 311,589

[22] Filed: Oct. 15, 1981

[51] Int. Cl.$^3$ .................. H03L 1/00; H03K 3/017
[52] U.S. Cl. ............................. 307/297; 307/304
[58] Field of Search ............... 307/296 R, 297, 304, 307/548, 568

[56] References Cited

U.S. PATENT DOCUMENTS

| | | | |
|---|---|---|---|
| 4,307,333 | 12/1981 | Hargrove | 307/304 X |
| 4,322,675 | 3/1982 | Lee et al. | 307/304 X |
| 4,336,466 | 6/1982 | Sud et al. | 307/297 |
| 4,356,412 | 10/1982 | Moench et al. | 307/304 |
| 4,378,506 | 3/1983 | Taira | 307/297 |

OTHER PUBLICATIONS

Chen and Park, "Feedback Substrate Bias Generator", *IBM Tech. Disc. Bull.*, vol. 23, No. 5, Oct. 1980, pp. 1930–1931.

*Primary Examiner*—Larry N. Anagnos
*Assistant Examiner*—David R. Hudspeth
*Attorney, Agent, or Firm*—Gary T. Aka; Patrick T. King

[57] ABSTRACT

An improved substrate bias generator is disclosed for use in a capacitive charge storage integrated circuit memory device having an external voltage supply. The generator comprises means for generating first and second timing signals, charge pumping means disposed for pumping positive charge from the substrate of the integrated circuit memory device in response to the first and second timing signals. Removal of the positive charge from the substrate polarizes the substrate at a negative potential, which is the generated bias voltage. A voltage regulation means is disposed between the output of the charge pumping means (i.e., the substrate) and the means for generating the timing signals. The voltage regulation means provides a reference potential that regulates the amount of charge pumped from the substrate as a function of the magnitude of the generated bias voltage. The voltage regulation means includes a voltage clamp circuit that is disposed for clamping the generated bias voltage to a limited negative value; a modulator circuit means disposed at the output of the voltage regulation means; and, a generator circuit means disposed at the output of the modulator circuit means for supplying the reference potential in response to the output voltage from the clamp circuit means as modified by the modulator circuit means.

17 Claims, 8 Drawing Figures

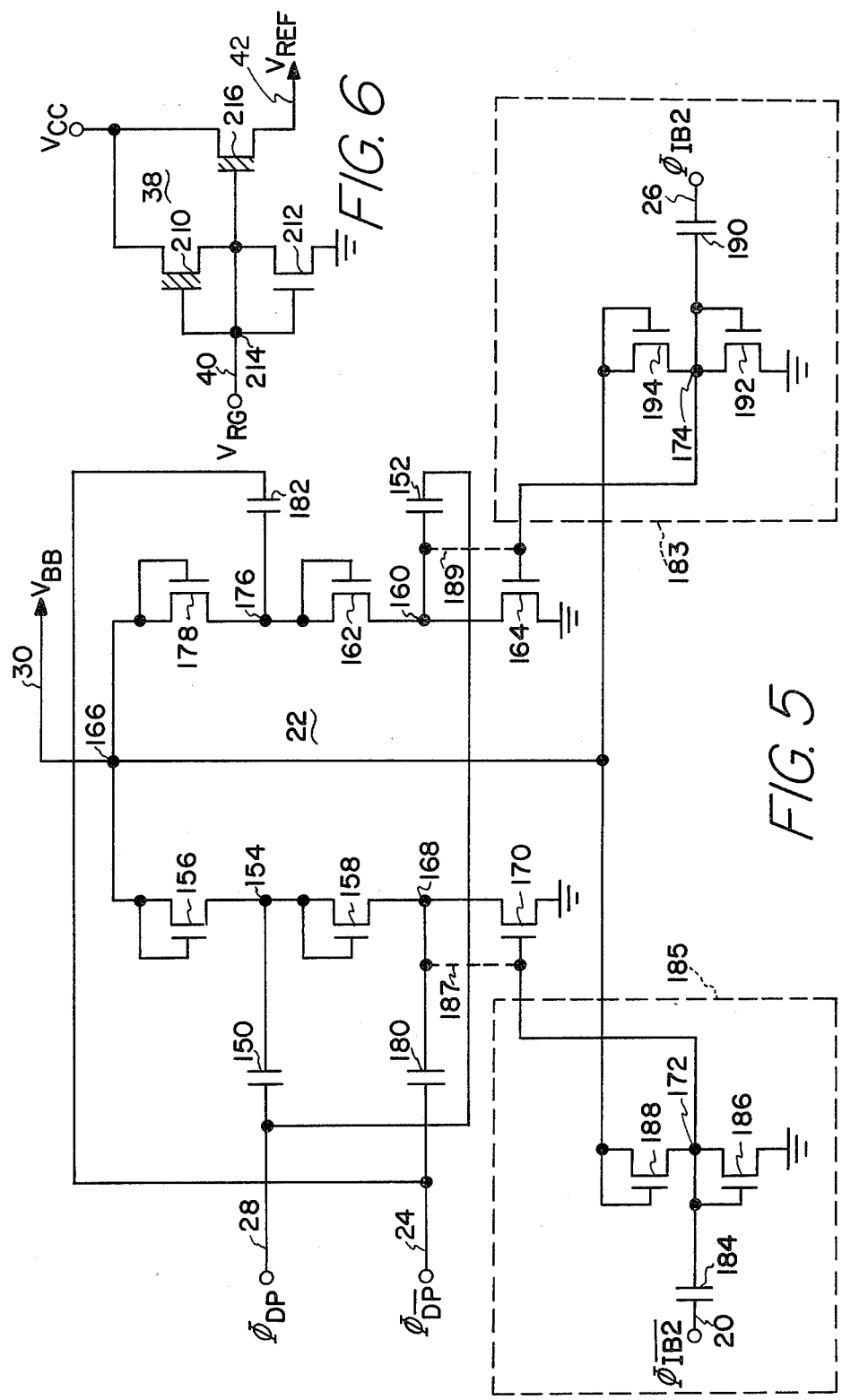

REGULATED SUBSTRATE BIAS GENERATOR FOR RANDOM ACCESS MEMORY

BACKGROUND OF THE INVENTION

1. Field of the Invention

This invention relates to bias voltage generation and regulation in an integrated circuit dynamic random access memory. In particular, the invention relates to the pumping of charge from the substrate of the integrated circuit in response to timing signals provided by sub-circuitry of the integrated circuit; and, to clamping and modulation circuitry provided for regulation of the generated bias voltage.

In the present generation of dynamic random access memories (RAM's), it is desirable to generate voltages within the integrated circuit itself (i.e., "on-chip" voltage generator), rather than using an external-power supply. This eliminates the need for an additional external pin connector to the RAM integrated circuit. Furthermore, advanced technologies that allow for larger scale integration of memory circuits typically have higher resistivity substrates, more narrow transistor gates and thinner oxide layers. However, in order to minimize junction capacitances as well as threshold sensitivity to the drain voltage when using high resistivity substrates, it is desirable to reverse bias the substrate of the integrated circuit. The most important advantage of reverse-bias is the much reduced probability of localized forward biasing of junctions, which forward biasing injects electrons into the substrate and can lead to a malfunction of the RAM circuits or even seriously reduce refresh times. Another advantage of reverse-biasing of the substrate is an improvement in the speed and power of operation of the RAM. Reverse biasing as used herein refers to the application of a negative voltage to the device substrate wherein such device is fabricated as n-channel MOS. A positive reverse bias would be used for p-channel MOS, and a combination of the two used for CMOS devices. 2. Description of the Prior Art The structure and operation of substrate bias generators for dynamic RAM's is taught elsewhere, for example, in papers by W. L. Martino, Jr., J. D. Moench, A. R. Bormann, and R. C. Tesch entitled "An On-Chip Back-Bias Generator for MOS Dynamic Memory," published in *IEEE Journal of Solid-State Circuits*, Vol. SC-15, No. 5, October, 1980, pp. 820–825; by J. M. Lee, J. R. Breivogel, R. Kunita and C. Webb entitled "A 80 ns 5 V-Only Kynamic RAM," published in the February 1979 proceedings of the *IEEE International Solid-State Circuits Conference*, pp. 142–143; by I. Itoh, R. Hori, H. Masuda and Y. Kamigaki entitled "A Single 5 V 64K Dynamic RAM" published in the February 1980 proceedings of the *IEEE Solid-State Circuits Conference*, pp. 228–229.

SUMMARY OF THE INVENTION

In accordance with this invention, an improved substrate bias generator is provided for use in a capacitive charge storage integrated circuit memory device having an external voltage supply. The generator comprises means for generating first and second timing signals, charge pumping means disposed for pumping positive charge from the substrate of the integrated circuit memory device in response to the first and second timing signals. Removal of the positive charge from the substrate polarizes the substrate at a negative potential, which is the generated bias voltage. A voltage regulation means is disposed between the output of the charge pumping means (i.e., the substrate) and the means for generating the timing signals. The voltage regulation means provides a reference potential that regulates the amount of charge pumped from the substrate as a function of the magnitude of the generated bias voltage.

The voltage regulation means includes a voltage clamp circuit that is disposed for clamping the generated bias voltage to a limited negative value; a modulator circuit means disposed at the output of the voltage regulation means; and, a generator circuit means disposed at the output of the modulator circuit means for supplying the reference potential in response to the output voltage from the clamp circuit means as modified by the modulator circuit means. An advantage of this invention is that the generated substrate bias voltage is regulated by an internally generated reference point independent of the external supply voltage.

As may be appreciated from the discussion hereinbelow, it will be shown that the use of the voltage regulation circuitry in combination with a double pump output stage provides a negative bias voltage that does not vary with power supply variations. Also, as may be further appreciated from the discussion hereinbelow, the problem of the traditional substrate bias generators, which simply drive the substrate negative, is overcome by the use of the voltage clamp circuit that limits the negative swing by which the substrate may be driven either capacitively or directly.

BRIEF DESCRIPTION OF THE DRAWINGS

The invention will be better understood by reference to the following detailed description taken in connection with the accompanying drawings in which:

FIG. 5 is a schematic diagram of the double pump output stage;

FIGS. 6 is a schematic diagram of the $V_{REF}$ generator;

DETAILED DESCRIPTION

Figure 1:
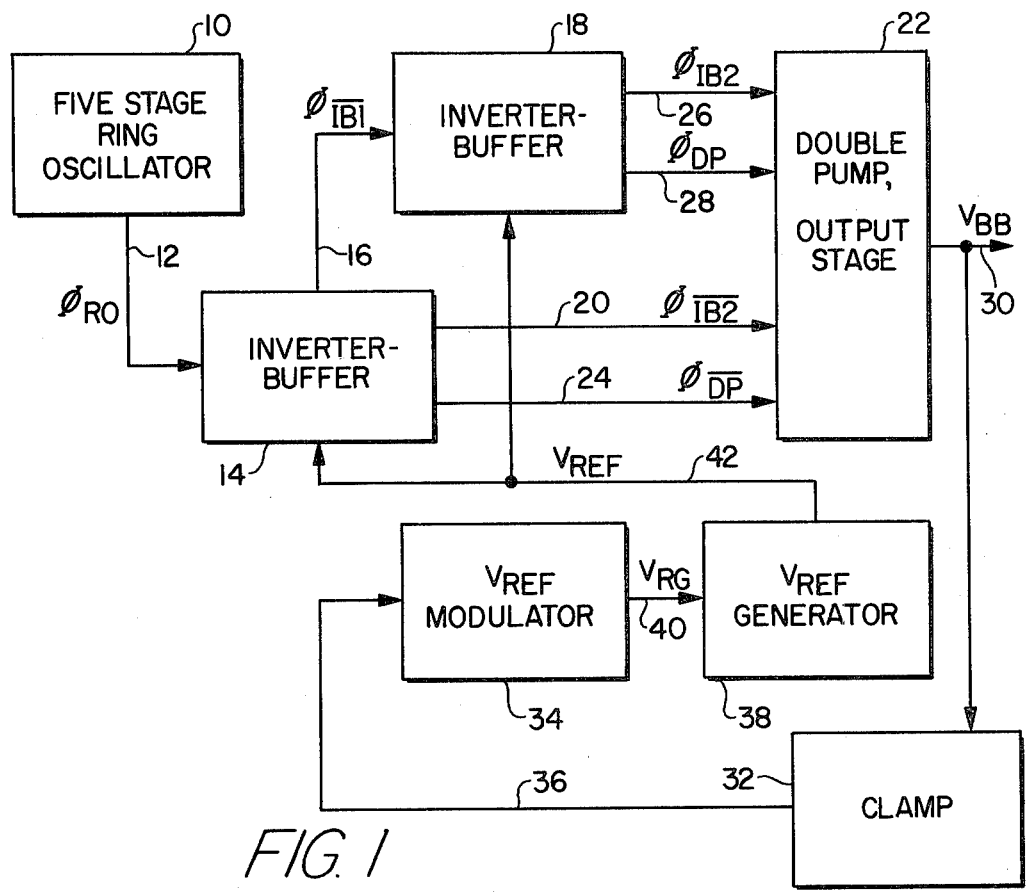
FIG. 1 is a block diagram of the substrate bias generator of this invention.

Referring now to the drawings, and in particular to FIG. 1, a block diagram of the improved substrate bias generator of this invention is illustrated. A five-stage ring oscillator 10 generates an oscillatory signal referred to herein as $\Phi_{RO}$, which signal is suppled on a line 12. The oscillator 10 comprises five stages of inverters, as will be described in greater detail hereinbelow. Each inverter stage drives the next subsequent stage, and the output of the last stage drives the first stage through a feedback loop. This type of oscillator is of conventional design, and is presently used throughout the industry. The oscillatory signal from the oscillator 10, supplied on the line 12 is provided as an input to an inverter buffer 14, which generates three timing signals in response to the $\Phi_{RO}$ timing signal supplied on the line 12. A first timing signal referred to herein as $\Phi_{\overline{IB1}}$, which is substantially 180° out of phase with the $\Phi_{RO}$ signal, is supplied on a line 16 as an input to a second inverter buffer 18. A second timing signal, which is referred to herein as $\Phi_{\overline{IB2}}$ is supplied from the buffer 14 on a line 20 to a double pump output stage 22. A third timing signal, which is referred to herein as $\Phi_{\overline{DP}}$ is supplied on a line 24 to a second input of the double pump output stage 22. The timing signals supplied on the lines 20 and 24 from the buffer 14 are substantially 180° out of phase with the $\Phi_{RO}$ timing signal from the oscillator 10, but are substantially in phase with one another. The inverter buffer 18 is of the same design as the buffer 14, and generates two additional timing signals that are provided on lines 26 and 28. One such timing signal is referred to herein as $\Phi_{IB2}$, and is supplied on the line 26 to a third input of the output stage 22. In a similar manner, another timing signal referred to herein as $\Phi_{DP}$ is supplied on the line 28 to a fourth input of the output stage 22.

The double pump output stage 22 functions to pump positive charge out of the substrate so as to generate the negative $V_{BB}$ bias voltage on a line 30. Each half of the double pump output stage 22 operates 180° out of phase from the other half. Note that the timing signals on the lines 26 and 28 are substantially in phase with one another, and the timing signals supplied on the lines 20 and 24 are likewise in phase with one another, but 180° out of phase with the timing signals supplied on the lines 26 and 28. The operation of the double pump output stage 22 will be explained in greater detail hereinbelow.

The bias voltage $V_{BB}$ supplied on the line 30 is also provided as an input to a clamp circuit 32. As will be shown hereinafter, the clamp circuit 32 is required to prevent loss of control of the substrate voltage which may be caused by excessive negative coupling. It is the function of the clamp circuit 32 to clamp the $V_{BB}$ bias voltage to a limited negative value, which in this embodiment is approximately −4.5 volts. The clamp circuitry uses a very high gain, fully static feedback technique which avoids any timing complications. Furthermore, the clamp circuitry consumes very little power. The output of the clamp circuitry 32 is impressed upon the input of a $V_{REF}$ modulator circuit 34 by means of a line 36. The modulator 34 allows for regulation of current into the substrate when the clamp 32 is operating.

The output of the modulator 34 is impressed upon a $V_{REF}$ generator 38 by means of a line 40. As will be demonstrated in more detail hereinafter, the generator 38 creates a voltage reference level which is independent of $V_{CC}$ and depends only upon the sum of one enhancement mode voltage threshold ($V_{TE}$) and magnitude of one depletion mode threshold voltage ($V_{TD}$). Because $V_{TE}$ increases with back bias and the absolute value of $V_{TD}$ decreases with back bias, the $V_{REF}$ potential remains substantially constant with changes of $V_{BB}$. The reference voltage $V_{REF}$ is supplied from the generator 38 on a line 42 to reference voltage input terminals of the inverter buffers 14 and 18.

For purposes of this description, $V_{TE}$ shall mean the threshold voltage for an enhancement mode transistor; which, in this embodiment, is approximately 0.85 volts. $V_{TD}$ shall mean the threshold voltage for a depletion mode transistor; which, in this embodiment, is approximately −2.8 volts. Furthermore, in the disclosed embodiment the $V_{CC}$ supply voltage is 5 volts, and the desired bias voltage $V_{BB}$ is preferably −4.5 volts.

In operation, when the supply voltage $V_{CC}$ is applied to the circuitry illustrated in FIG. 1, the oscillator 10 begins to oscillate thereby providing the $\Phi_{RO}$ timing signal on the line 12. The inverter buffer 14 generates the three timing signals $\Phi_{\overline{IB1}}$, $\Phi_{\overline{IB2}}$ and $\Phi_{\overline{DP}}$ in response to the $\Phi_{RO}$ timing signal. The inverter buffer 18 is operating 180° out of phase with the inverter buffer 14, and supplies the $\Phi_{IB2}$ and $\Phi_{DP}$ timing signals to the double pump output stage 22. As a function of the four timing signals supplied to the output stage 22, the double pump 22 pumps charge out of the substrate to generate the bias voltage $V_{BB}$ on the line 30. The clamp circuit 32, $V_{REF}$ modulator circuit 34 and the $V_{REF}$ generator 38 act to regulate the magnitude of the bias voltage $V_{BB}$ by providing a feedback voltage $V_{REF}$ on a line 42, and by providing a positive current to $V_{BB}$ on the line 30.

Figure 2:
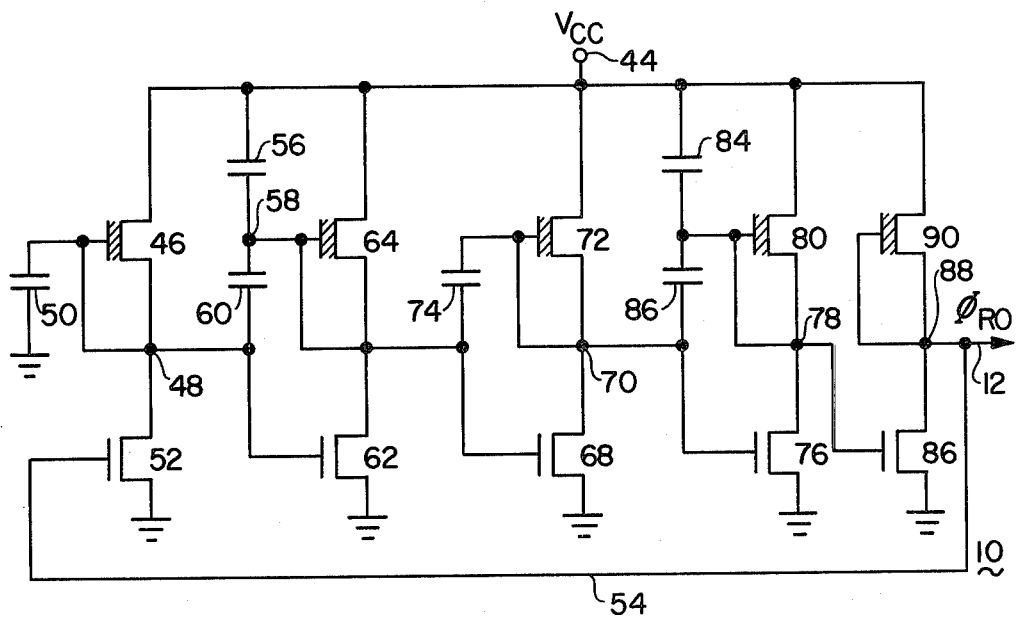
FIG. 2 is a schematic diagram of the ring oscillator.

Referring now to FIG. 2, a detailed schematic diagram of the oscillator 10 is shown. It is noted that the disclosed embodiment of this invention was manufactured of metal oxide semiconductors (MOS). The supply voltage $V_{CC}$ is provided on a terminal 44, which is coupled to the drain terminal of a depletion mode transistor 46 and the source terminal thereof is coupled to a node 48. A depletion mode transistor is represented schematically in the drawings by cross-hatching adjacent to the gate terminal, while an enhancement mode transistor is depicted without such cross-hatching. The gate terminal of the transistor 46 is coupled to one side of a capacitor 50, and the other side of this capacitor is coupled to ground potential. The gate terminal of the transistor 46 is coupled to the node 48, which is also coupled to the source terminal of this same transistor. Such a connection of a depletion mode transistor forms a current limiting resistor. The node 48 is coupled to the drain terminal of a transistor 52 and the source terminal thereof is coupled to ground potential. The gate terminal of the transistor 52 is coupled back to the output line 12 of the oscillator 10 by means of a feedback line 54.

The $V_{CC}$ terminal 44 is also coupled to one side of a capacitor 56 and the other side of this capacitor is coupled to a node 58. The node 58 is coupled to one side of a second capacitor 60 and the second side of this capacitor is coupled to the node 48, and to the gate terminal of a transistor 62. The node 58 is coupled to the gate terminal of a transistor 64 having the drain terminal thereof coupled to the $V_{CC}$ terminal 44 and the source terminal thereof is coupled to a node 58. The node 58 is coupled to the drain terminal of the transistor 62 and the source terminal thereof is coupled to ground potential.

The node 58 is coupled to the gate terminal of a transistor 68 having a source terminal thereof coupled to ground potential. The drain terminal of the transistor 68 is coupled to a node 70. The node 70 is coupled to the source terminal of a depletion mode transistor 72 having a drain terminal thereof coupled to the $V_{CC}$ terminal 44. The gate terminal of the transistor 72 is coupled to one side of a capacitor 74 and to the node 70. The second side of the capacitor 74 is coupled to the node 58. The node 70 is coupled to the gate terminal of a transistor 76 having a source terminal thereof coupled to ground potential. The drain terminal of the transistor 76 is coupled to a node 78. The node 78 is coupled to the source terminal of a depletion mode transistor 80 having the drain terminal thereof coupled to the $V_{CC}$ terminal 44. The gate terminal of the transistor 80 is coupled to the node 78, which forms a common connection between capacitors 84 and 86. The second side of the capacitor 86 is coupled to the gate terminal of the transistor 76 and to the node 70. The opposite side of the capacitor 84 is coupled to the $V_{CC}$ terminal 44. The node 78 is coupled to the gate terminal of a transistor 86 having the source terminal thereof coupled to ground potential, and the drain terminal of this transistor is coupled to a node 88. The node 88 is coupled to the output line 12, to the source terminal of a transistor 90 and to the gate terminal of this same transistor 90. The drain terminal of the transistor 90 is coupled to the $V_{CC}$ terminal 44.

It is the function of the oscillator 10 to generate the $\Phi_{RO}$ timing signal on the line 12 when power is applied to the terminal 44. Offsetting capacitors, such as capacitors 50, 56 and 84, are employed to ensure that the oscillator will oscillate when power is applied to the terminal 44. In operation, it is the function of the capacitor 50 to dynamically bias the node 48 at a voltage level close to ground potential ($V_{SS}$). Note that the capacitors 56 and 84 are coupled between $V_{CC}$ on the terminal 44 and the nodes 58 and 78, respectively. As the power is applied to the circuitry, $V_{CC}$ is ramping up from a zero level to a +5 volt level, and capacitor 56 will dynamically couple the node 58 up to approximately this same voltage level and capacitor 84 will likewise dynamically couple node 78 to the same level. Node 48 is preferentially coupled to ground potential, and nodes 58 and 78 are preferentially coupled to the supply voltage $V_{CC}$. As the $V_{CC}$ supply voltage ramps up, the node 58 will rise faster than will the potential on the node 48. This offsetting of potential will occur through each subsequent stage of the oscillator 10. It is not desirable to have all the nodes 48, 58, 70, 78 and 88 somehow biased at the same potential at the same time.

A negative feedback is provided on the line 54 to the gate terminal of the transistor 52. Note,, for example, that if the node 48 is at a low potential, the node 58 is at a high potential, the node 70 is at a low potential, and there is a high potential on the node 78. A low potential will thus be felt on the line 12 which low potential is coupled back to the gate of the transistor 52, thereby cutting off this transistor. Node 48 will then rise to the $V_{CC}$ level, which will invert the entire chain of inverters. When this occurs, and the potential on the node 88 is high, this high potential is coupled back to the input of a transistor 52, thereby turning on this transistor and coupling the node 48 back to a ground potential. This action will repeat and provide the oscillatory timing signal $\Phi_{RO}$ on the line 12.

Figure 3:
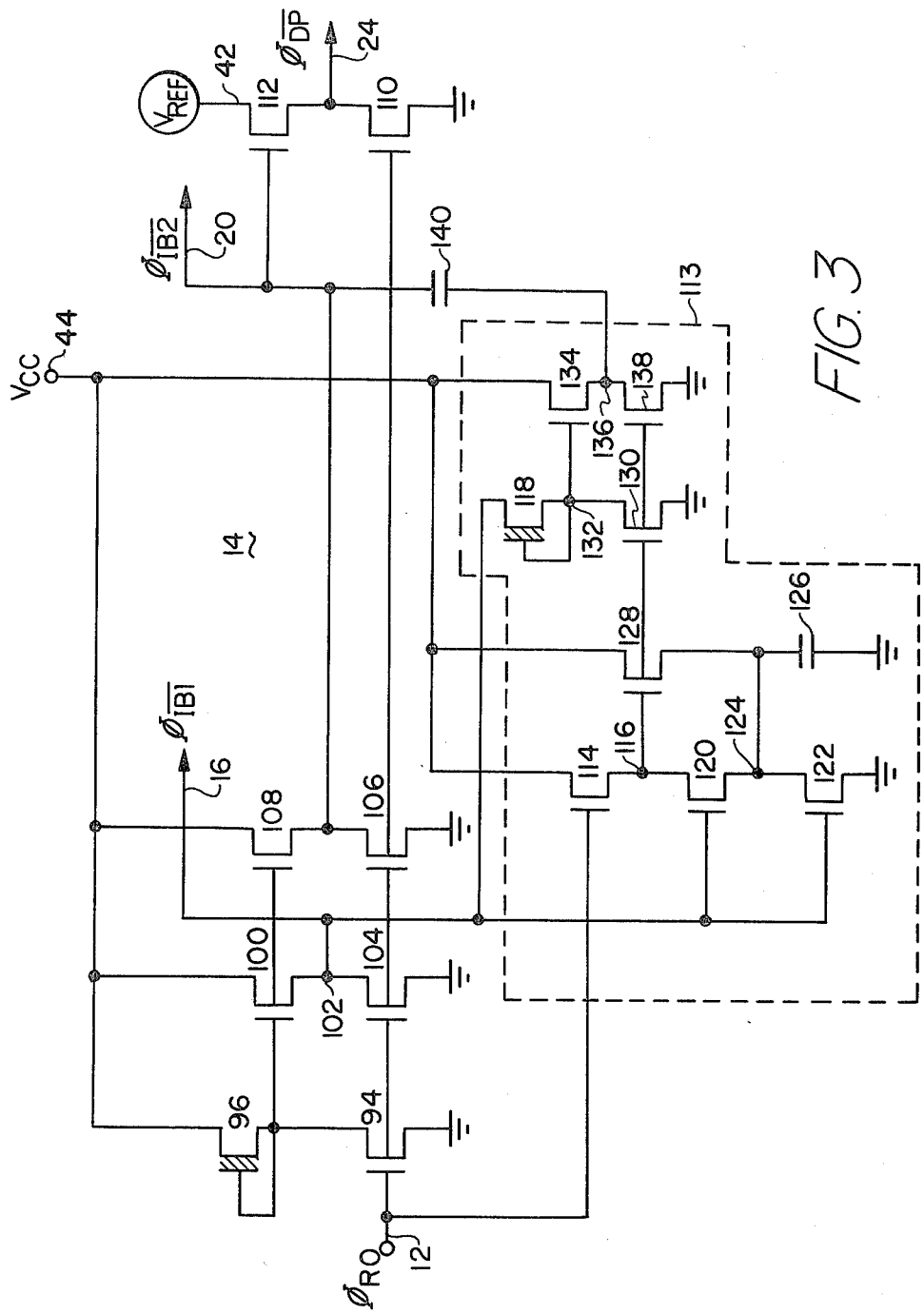
FIGS. 3 and 4 are schematic diagrams of the inverter-buffers.

Referring now to FIG. 3, a detail schematic diagram of the inverter buffer 14 is illustrated in greater detail. As alluded to hereinabove, it is the function of the inverter buffer 14 to generate further timing signals in response to the $\Phi_{RO}$ timing signal provided on the line 12 from the oscillator 10. The line 12 is coupled to the gate terminal of a transistor 94 having the source terminal thereof coupled to ground potential and the drain terminal thereof coupled to the source terminal of a transistor 96. The source terminal of the transistor 96 is also coupled to the gate terminal thereof and the drain terminal of this transistor is coupled to the supply voltage ($V_{CC}$) on the terminal 44. Note that the transistor 96 is coupled as a current limiting resistor. The source terminal of the transistor 96 is coupled to the gate terminal of a transistor 100. The drain terminal of the transistor 100 is coupled to the $V_{CC}$ terminal 44 and the source terminal thereof is coupled to a node 102. Node 102 is coupled to the drain terminal of a transistor 104 having the gate terminal thereof also coupled to the input line 12. The source terminal of the transistor 104 is coupled to ground potential. The node 102 is coupled to the output line 16. Also, note that the transistors 94, 96, 100 and 104 form an inverter which thereby inverts the $\Phi_{RO}$ timing signal such that the $\Phi_{\overline{IB1}}$ timing signal is generated substantially 180° out of phase with the $\Phi_{RO}$ timing signal. The line 12 is also coupled to the gate terminal of a transistor 106 having the source terminal thereof coupled to ground potential and the drain terminal coupled to the source terminal of a transistor 108. The gate terminal of the transistor 108 is coupled to the gate terminal of the transistor 100, which is also coupled to the source terminal of the transistor 96. The drain terminal of the transistor 108 is coupled to the supply voltage terminal 44. The common connection of the drain terminal of the transistor 106 and the source terminal of the transistor 108 is also coupled to the output signal line 20, which provides the $\Phi_{\overline{IB2}}$ timing signal.

The line 12 is also coupled to the gate terminal of a transistor 110 having the source terminal thereof coupled to ground potential and the drain terminal coupled to the line 24. The line 20 is coupled to the gate terminal of a transistor 112 having the source terminal thereof coupled to the line 24 and the drain terminal thereof coupled to $V_{REF}$ voltage line 42 from the $V_{REF}$ generator 38 (FIG. 1).

That portion of the circuitry shown in FIG. 3 enclosed within dashed line 113 forms a Schmidt trigger, which is used in the buffer to provide a delayed boosting of the $\Phi_{\overline{IB2}}$ signal to a level above the $V_{CC}$ supply voltage. This will provide for fully charging the $\Phi_{\overline{DP}}$ timing signal on the line 24 to a full $V_{REF}$ level (typically, 3.65 volts). In particular, the line 12 is coupled to a gate terminal of a transistor 114 having the source terminal thereof coupled to a node 116 and the drain terminal thereof coupled to the supply voltage terminal 44. The node 102 is coupled to the drain terminal of a transistor 118, to the gate terminal of a transistor 120 and to the gate terminal of a transistor 122. The drain terminal of the transistor 120 is coupled to the node 116 and the source terminal thereof is coupled to a node 124. The drain terminal of the transistor 122 is coupled to the node 124 and the source terminal thereof is coupled to ground potential. The node 124 is also coupled to one side of a capacitor 126 and to the source terminal of a transistor 128. The second side of capacitor 126 is coupled to ground potential. The gate terminal of the transistor 128 is coupled to the node 116 and the drain terminal thereof is coupled to the supply voltage terminal 44. The node 116 is also coupled to the gate terminal of the transistor 130 having the source terminal thereof coupled to ground potential and the drain terminal thereof coupled to a node 132. The node 132 is also coupled to the gate and source terminals of the transistor 118 thereby forming a current limiting resistor. The node 132 is likewise coupled to the gate terminal of a transistor 134 having the source terminal thereof coupled to a node 136 and its drain terminal coupled to $V_{CC}$ on the terminal 44. The gate terminal of the transistor 130 is coupled to the gate terminal of a transistor 138 having the source terminal thereof coupled to ground potential and the drain terminal thereof coupled to a node 136. The node 136 is coupled to one side of a capacitor 140 having the other side thereof coupled to the line 20.

In operation, the timing signal $\Phi_{\overline{IB1}}$ supplied on the line 16 is logically the same as the timing signal $\Phi_{\overline{IB2}}$ supplied on the line 20. However, the timing signal $\Phi_{\overline{IB2}}$ receives an added output drive ("boost") from the Schmidt trigger 113.

The transistors 106 and 108 will initially charge the $\Phi_{\overline{IB2}}$ timing signal up toward the $V_{CC}$ supply voltage minus one voltage threshold. Capacitor 140 is also charged up to $V_{CC}$ minus one $V_{TE}$. Node 136 is held at ground potential by the Schmidt trigger 113, which also provides a timing delay. The signal on the gate of the transistor 130 is inverted from the signal $\Phi_{\overline{IB1}}$. Hence, when the potential of the transistor 130 is discharged to zero volts, node 136 will go from a zero level to a high level. Node 136 is delayed from the timing signal $\Phi_{\overline{IB1}}$, but with the same polarity. That is, the timing signal will be delayed until the $\Phi_{IB1}$ timing signal is charged up to a high level. At this time, node 136 goes from a 0 level to a high level, which couples the $\Phi_{\overline{IB2}}$ timing signal to an even higher level through the capacitor 140. The purpose of this operation is to take the $\Phi_{\overline{IB2}}$ timing signal to a very high voltage level so that the $\Phi_{\overline{DP}}$ timing signal can be charged to a full $V_{REF}$ potential. In this manner, the circuit can be operated at a low supply voltage, much lower than the typical industry standard of +5 volts. That is, the circuitry could still operate at a supply voltage of approximately 3 volts. Note that the magnitude of the $V_{REF}$ potential determines the amount of charge pumped from the substrate by the charge pumps.

Figure 8:
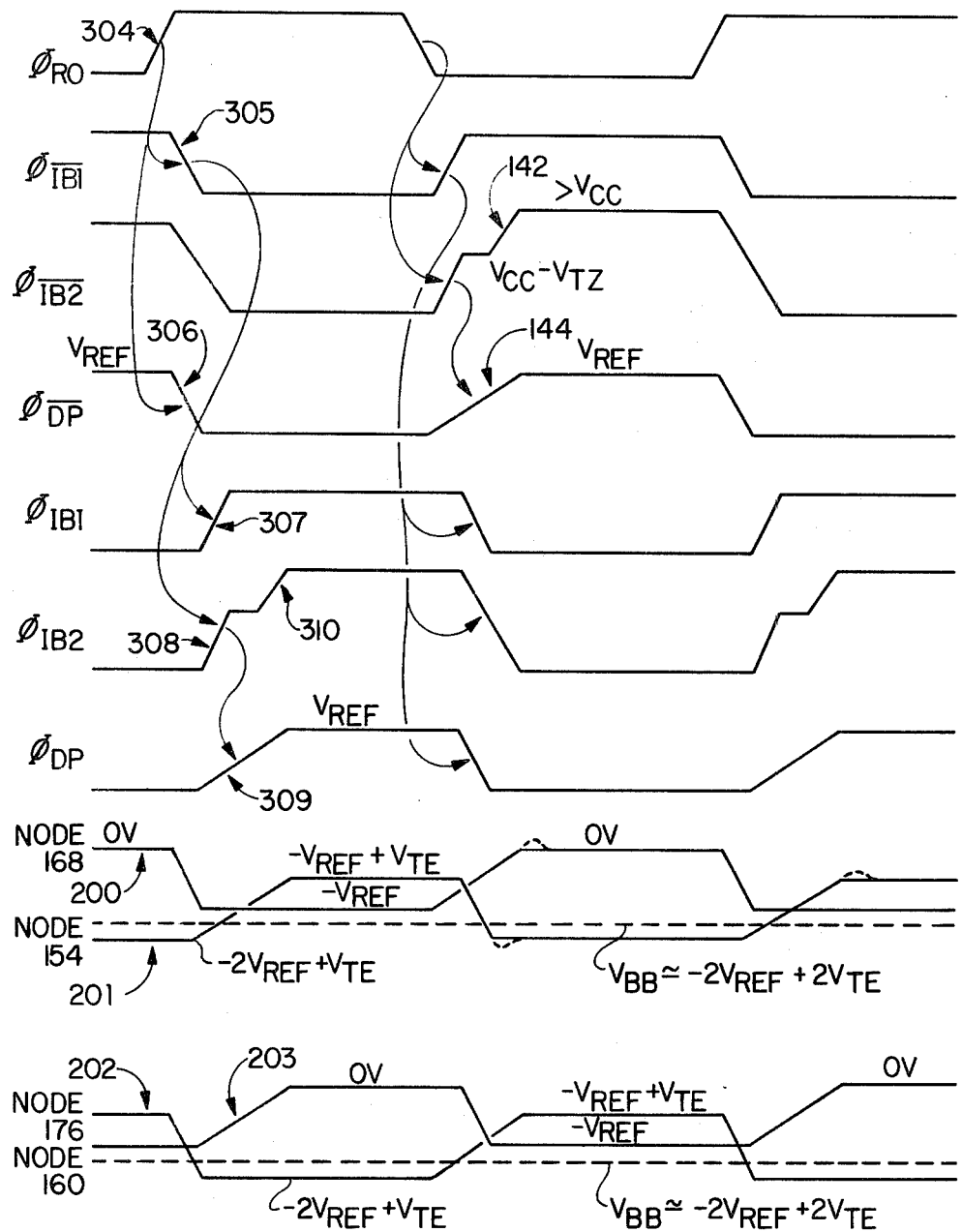

At this juncture of the description, brief reference is made to the timing diagram of FIG. 8, and in particular to the waveforms of the $\Phi_{\overline{IB2}}$ and $\Phi_{\overline{DP}}$ timing signals. Specific reference is made to portion 142 of the $\Phi_{\overline{IB2}}$ timing signal. This portion rises to a value greater than the $V_{CC}$ supply voltage. Note also with reference to the $\Phi_{\overline{DP}}$ timing signal that at portion 144 thereof, the $\Phi_{\overline{DP}}$ timing signal is allowed to charge to the full $V_{REF}$ level.

Figure 4:
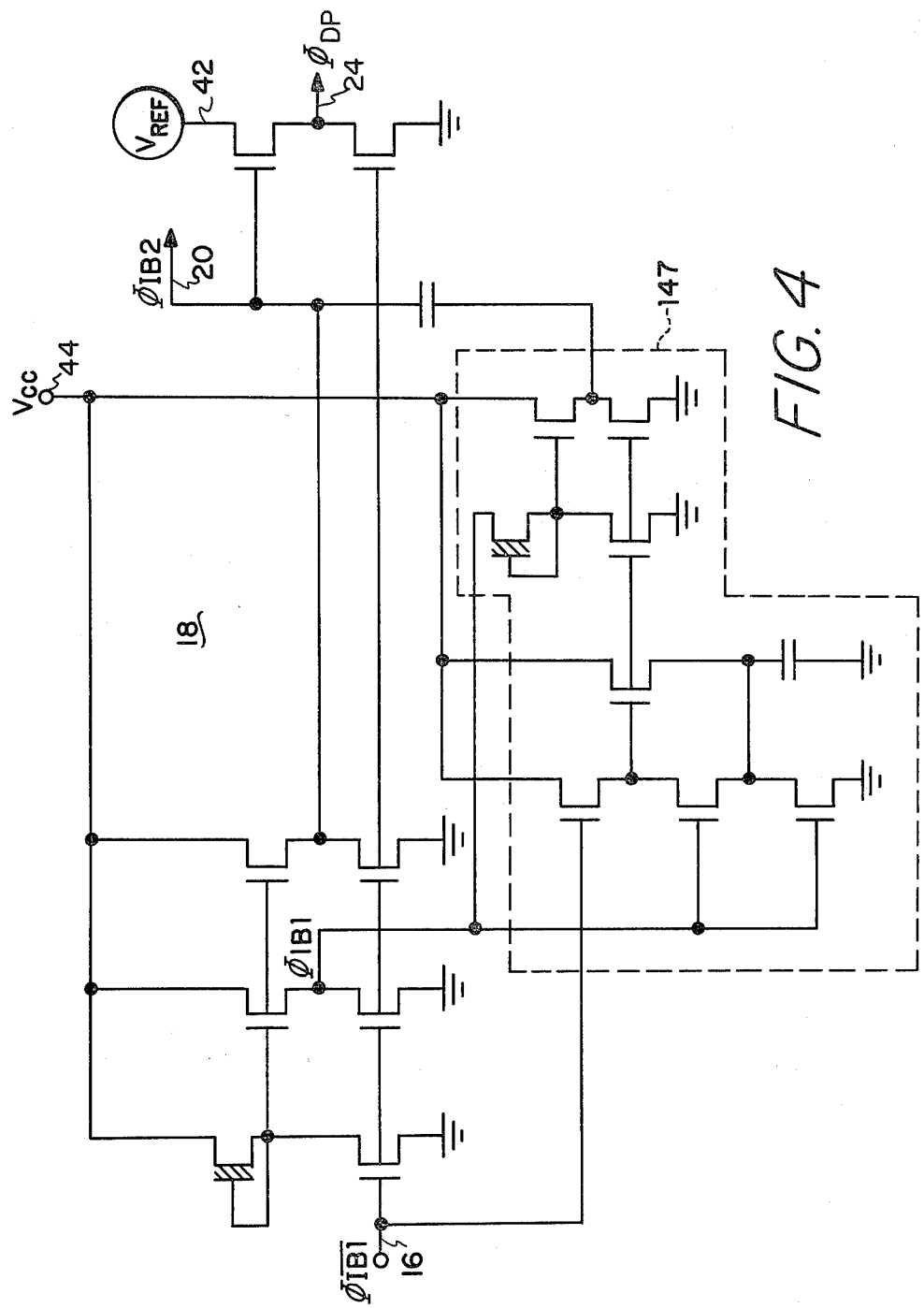

Inverter Buffer 18 is illustrated in FIG. 4, which buffer is substantially the same as the buffer 14, also including a Schmidt trigger 147. Thus, this buffer will not be described further hereinafter.

Referring now to FIG. 5, a schematic diagram of the double pump output stage 22 is illustrated in greater detail. The $\Phi_{DP}$ clock signal, supplied on the line 28, is provided on one side of a capacitor 150, and at the same time on one side of a capacitor 152. The second side of the capacitor 150 is coupled to a circuit node 154, which is a common connection point between the source of a transistor 156 and the drain and gate terminals of a transistor 158. The second side of the capacitor 152 is coupled to a circuit node 160, which is the common connection between the source of a transistor 162 and the drain of a transistor 164. The drain terminal of the transistor 156 is coupled to the gate terminal thereof and to a circuit node 166, which is coupled to the $V_{BB}$ output line 30. The source terminal of the transistor 156 is coupled to a node 168, and to the drain terminal of a transistor 170. The source terminal of the transistor 170 is coupled to ground potential and the gate terminal thereof is coupled to a circuit node 172.

The source terminal of the transistor 164 is coupled to ground potential and the gate terminal thereof is coupled to a node 174. The drain terminal of the transistor 162 is coupled to the gate terminal thereof and to a circuit node 176, which circuit node is also coupled to the source terminal of a transistor 178. The drain terminal of the transistor 178 is coupled to the gate terminal thereof and to the node 166.

The $\Phi_{\overline{DP}}$ timing signal, supplied on the line 24, is coupled to one side of a capacitor 180, and also to one side of a capacitor 182. The second side of the capacitor 180 is coupled to the node 168, and the second side of the capacitor 182 is coupled to the node 176. As stated hereinabove, the double pump output stage 22 may be configured to operate without the $\Phi_{\overline{IB2}}$ timing signals. In such a configuration, the circuit portions enclosed within the dashed lines 183 and 185 are omitted; and, the gate terminals of the transistors 164 and 170 are connected to the nodes 160 and 168, respectively. These latter circuit connection modifications are illustrated by the dashed lines 187 and 189.

In the illustrated embodiment including the circuit portions 183 and 185, the $\Phi_{\overline{IB2}}$ timing signal, supplied on the line 20, is coupled to one side of a capacitor 184. The second side of the capacitor 184 is coupled to the circuit node 172, which node is also coupled to the gate terminal of a transistor 186 and to the drain terminal of the same transistor. The source terminal of the transistor 186 is coupled to ground potential. The circuit node 172 is also coupled to the gate terminal of the transistor 170, and the source terminal of a transistor 188. The drain terminal of the transistor 188 is coupled to the gate terminal thereof and to the circuit node 166. The $\Phi_{IB2}$ timing signal, supplied on the line 26, is coupled to one side of a capacitor 190. The second side of the capacitor 190 is coupled to the circuit node 174 and to the gate terminal of a transistor 192. The source terminal of the transistor 192 is coupled to ground potential and the drain terminal thereof is coupled to the circuit node 174. The source terminal of a transistor 194 is also coupled to the circuit node 174. The drain terminal of a transistor 194 is coupled to the gate terminal thereof and to the circuit node 166.

As alluded to hereinabove, it is the function of the double pump output stage to pump charge out of the device substrate so as to generate the desired $V_{BB}$. The illustrated arrangement is used because the $V_{REF}$ level should be less than the $V_{CC}$ level, and therefore requires two pump stages so as to generate a sufficient $V_{BB}$ level. Each side of the pump operates substantially 180° out of phase with the other side. A first side, as shown in FIG. 5, comprises transistors 156, 158 and 170. In a similar manner, the second side comprises transistors 178, 162 and 164. More particularly, each side takes a packet of positive charge out of the substrate on the line 30 and sequentially transfers this packet of charge to ground potential in response to the clock signals $\Phi_{DP}$ and $\Phi_{\overline{DP}}$. As a result of removing positive charge from the device substrate, the $V_{BB}$ level will go towards a negative value. The combining of the two double pumps at the node 166 forms a full-wave rectifier, which makes the current sinking capacity of the bias generator much less sensitive to other timing signals used in a dynamic RAM.

Assume, for example, that the $\Phi_{DP}$ timing signal on the line 28 is at a high level, and the $\Phi_{\overline{DP}}$ timing signal on the line 24 is at a low level. Also, assume that the voltage levels on the nodes 154 and 168 are at zero volts. The capacitors 150, 152, 180 and 182 are large capacitors. Thus, when the $\Phi_{DP}$ timing signal on the line 28 goes from a high level down to a low level, then the node 154 is pumped down to a $-V_{REF}$ level. Transistor 156 is thus turned on, and current flows from the node 166 to the node 154. During this time, the transistor 158 is turned off because the node 154 is at a negative value, and the node 168 is at zero volts. That is, the transistor 158 (which is coupled as a diode) is reverse biased. When the $\Phi_{DP}$ timing signal is going down the $\Phi_{\overline{DP}}$ timing signal is going up (i.e., 180° out of phase). The node 168 is held at zero volts by the transistor 170 because the node 172 is being coupled up at the same time to a high level by the $\Phi_{\overline{IB2}}$ signal supplied on the line 20 through the capacitor 184. That is, when the $\Phi_{IB2}$ timing signal is moving up, the node 172 is capacitively coupled up through the capacitor 184. However, the node 172 is clamped at one $V_{TE}$ by the transistor 186. Transistor 170 turns on which holds the node 168 at zero volts. That is, the rising edges of the timing signals hold the node 168 at zero volts while the capacitor 180 is charging.

When the $\Phi_{\overline{DP}}$ timing signal goes back to a zero level, the node 168 starts from zero volts and is capacitively coupled down to the $-V_{REF}$ level. The timing signal $\Phi_{\overline{IB2}}$ is also going back to zero volts at the same time thus turning off the transistor 170. Thus far, we have established a current flow only through the transistor 156. The node 154 is returning back to a zero level because of the capacitive coupling action of the $\Phi_{DP}$ timing signal through the capacitor 150. With the node 154 at zero volts and the node 168 at a negative value, the transistor 158 turns on. This establishes a current flow from the node 154 to the node 168, which is the very same current that flowed earlier through the transistor 156 from the node 166.

The transistors 178, 162 and 164 operate in the same manner in response to $\Phi_{DP}$, $\Phi_{\overline{DP}}$ and $\Phi_{IB2}$ timing signals.

In summary, we take a positive charge out of the substrate and put this charge on the node 154. On the succeeding cycle of the timing signals, this same charge is moved to the node 168. With the next succeeding timing cycle, the $\Phi_{DP}$ timing signal goes from a zero level to a high level and the $\Phi_{\overline{IB2}}$ timing signal also goes to a high level. This capacitively couples node 172 to a high level which turns on the transistor 170. This action establishes a current flow from the node 168 to ground potential. Accordingly, it may be appreciated that it takes several cycles to move a small packet of charge from the node 166 (the substrate) to ground potential. Note that the size of the charge packet (amount of charge) is proportional to the magnitude of the $V_{REF}$ potential (amplitude of the $\Phi_{DP}$ and $\Phi_{\overline{DP}}$ timing signals). Accordingly, by regulating the magnitude of the $V_{REF}$ potential, the amount of charge removed from the substrate is regulated. Hence, the magnitude of the generated bias voltage ($V_{BB}$) is regulated by regulating the magnitude of the $V_{REF}$ potential.

Reference is made to the timing diagram in FIG. 8, wherein waveforms 200, 201, 202 and 203 illustrate the above described potentials on nodes 168, 154, 176 and 160, respectively, in response to the timing signals applied to the double pump output stage 22. Note, however, that if the circuit portions 183 and 185 in FIG. 5 are omitted, and the connections 187 and 189 are made, the potentials of the waveforms 200 thru 203 will shift up (in a positive direction) by one $V_{TE}$. This will change the $V_{BB}$ level accordingly as follows:

$$V_{BB} \cong -2V_{REF} + 3V_{TE}$$

The $\Phi_{RO}$ timing signal is a symmetrical oscillatory signal having a frequency determined by the natural frequency of oscillation of the ring oscillator 10. In this embodiment the $\Phi_{RO}$ timing may have a frequency within the range of 3 to 12 MHz for satisfactory operation. Leading edge portion 304 of the $\Phi_{RO}$ timing signal triggers the leading edge portions 305 and 306 of the $\Phi_{\overline{IB1}}$ and $\Phi_{\overline{DP}}$ timing signals, respectively. This timing relationship is effected by operation of the inverter buffer 14 (FIG. 3). The leading edge portion 305 of the $\Phi_{\overline{IB1}}$ timing signal triggers leading edge portions 307 and 308 of the $\Phi_{IB1}$ and $\Phi_{IB2}$ timing signals, respectively. In a similar manner, leading edge portion 308 triggers leading edge portion 309 of the $\Phi_{DP}$ timing signal. These timing relationships are effected by operation of the inverter buffer 18. Portion 310 of the $\Phi_{IB2}$ timing signal constitutes the delayed boost from the Schmidt trigger 147 of the inverter buffer 18, which allows sufficient time for the $\Phi_{DP}$ timing signal to charge up to the full $V_{REF}$ potential.

Referring now to FIG. 6, a schematic diagram of the $V_{REF}$ generator 38 is illustrated in greater detail. The line 40, from the modulator 34 (FIG. 1) which transmits the $V_{RG}$ voltage level to this circuit, is coupled to the gate terminal of a depletion mode transistor 210 and to the gate terminal of an enhancement mode transistor 212 at a node 214. The node 214 is coupled to the source terminal of the transistor 210 and to the drain terminal of the transistor 212. The source terminal of the transistor 212 is coupled to ground potential and the drain terminal of the transistor 210 is coupled to the $V_{CC}$ supply voltage on the terminal 44. The node 214 is also coupled to the gate terminal of a depletion mode transistor 216 having the drain terminal thereof coupled to $V_{CC}$ on the terminal 44. The source terminal of the transistor 216, which provides the $V_{REF}$ potential, is coupled to the line 42 for supplying this potential to the inverter buffers 14 and 18.

The $V_{RG}$ voltage level on the line 40 is biased at substantially one $V_{TE}$ through the transistors 210 and 212. The transistor 210 is a high impedance load and the transistor 212 is a large enhancement mode transistor (connected in a diode configuration). With a level on the line 40 at one $V_{TE}$, $V_{REF}$ is established at one $V_{TE}$ plus the magnitude of one $V_{TD}$ independent of the $V_{CC}$ supply voltage.

The $V_{REF}$ potential is substantially unaffected by manufacturing process variations, because the process variations affecting the $V_{TE}$ of the transistor 212 offset in the opposite direction the process variations affecting the magnitude of the $V_{TD}$ of the transistor 216.

Figure 7:
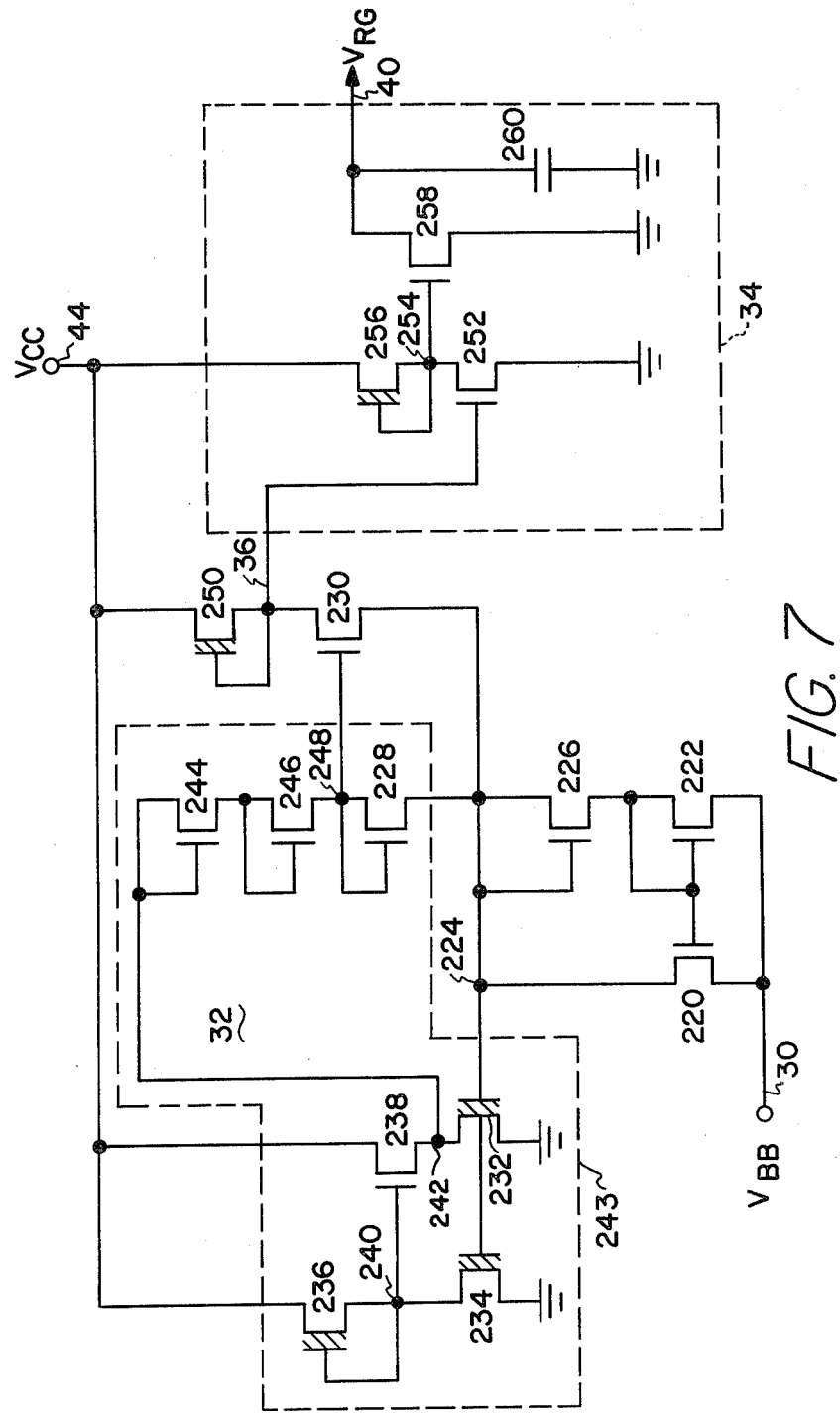
FIG. 7 is a schematic diagram of the clamp circuit and the $V_{REF}$ modulator; and, FIG. 8 is a timing diagram showing the operation of the constituent circuitry of the substrate bias generator.

Referring now to FIG. 7, a detailed schematic diagram of the clamp circuit 32 and the $V_{REF}$ modulator circuit 34 is shown. The line 30 from the output of the double pump output stage 22 is coupled to the source terminal of transistors 220 and 222. The gate terminals of these transistors are coupled together and this connection is coupled to the drain terminal of the transistor 222 and the source terminal of a transistor 226. The drain terminal of the transistor 220 is coupled to a circuit node 224, which is also coupled to both the gate and drain terminals of the transistor 226. The circuit node 224 is further coupled to the source terminals of enhancement mode transistors 228 and 230, and to gate terminals of depletion mode transistors 232 and 234. The source terminals of the transistors 232 and 234 are coupled to ground potential. The drain terminal of the transistor 234 is coupled to the source and gate terminals of a depletion mode transistor 236 and the gate terminal of a transistor 238 at a node 240. The drain terminals of the transistors 236 and 238 are coupled to $V_{CC}$ supplied on the terminal 44. The drain terminal of the transistor 232 is coupled to the source terminal of the transistor 238 at a node 242. The circuit portion 243, including the transistors 232, 234, 236, 238, 228, 244 and 246 is a negative voltage level generator. The level generator 243 is activated in response to $V_{BB}$ being coupled to the node 224 through the transistors 222 and 226. The circuit portion 243 generally will then clamp the node 224 at a level approximately equal to one $V_{TD}$.

The node 242 is coupled to the drain and gate terminals of a transistor 244, and the source terminal of this transistor is coupled to the gate and drain terminals of a transistor 246. The source terminal of the transistor 246 is coupled to the drain and gate terminals of the transistor 228 at a node 248. The node 248 is also coupled to the gate terminal of the transistor 230 and the drain terminal of this transistor is coupled to the output line 36 at the common connection of the source and gate terminals of a depletion mode transistor 250. The drain terminal of the transistor 250 is coupled to $V_{CC}$.

Assume, for example, that the node 224 is initially biased at zero volts. The transistors 234 and 236 will be turned on, which will put the node 240 at approximately ground potential thereby turning off the transistor 238 placing the node 242 at approximately ground potential. At this time, the transistors 244, 246 and 228 are turned off and there is no voltage across these transistors. Thus, the node 224 is floating. The transistors 220, 222 and 226 will provide a current path from the node 224 to the $V_{BB}$ output line 30. When the $V_{BB}$ level is at some excessive negative value, the node 224 will be pulled down to a negative value sufficient enough to turn off the transistors 232 and 234. This will occur when the node 224 reaches approximately one $V_{TD}$ (−2.8 volts). The nodes 240 and 242 will then start moving upward, which will provide a current flow through the transistors 244, 246 and 228. The node 248 rises turning on the transistor 230, which will cause the potential on the node 244 to rise. This arrangement is a negative feedback such that the whole circuit will be biased at the D.C. operating point, which occurs roughly when the node 224 is equal to one $V_{TD}$ (−2.8 volts). Note that this is independent of the $V_{CC}$ supply voltage.

The objective is to supply a large positive current into $V_{BB}$ when the voltage level goes below the quiescent operating point thereof of the node 224 by two $V_{TE}$. This current is supplied by a current steering network including two current mirrors. One current mirror comprises the transistors 220, 222 and 226, and the second current mirror comprises the transistors 228, 230 and 250.

The function of the first current mirror is to provide a low impedance clamp at the desired voltage level (node 224 minus two $V_{TE}$). The function of the second current mirror is to avoid pulling too much current out of the transistor 228, which could change the DC operating point of the clamp circuitry. When the $V_{BB}$ level goes excessively negative, a large amount of current flows through the transistor 230 thereby reducing the potential on the line 36. This change in potential is detected by the modulator circuit 34, which grounds $V_{RG}$ on the line 40, acting to modulate the $V_{REF}$ potential.

The line 36 coupling the clamp circuit 32 to the $V_{REF}$ modulator circuit 34 is also coupled to the gate terminal of a transistor 252 within the circuit 34. The source terminal of the transistor 252 is coupled to ground potential and the drain terminal thereof is coupled to a circuit node 254. The circuit node 254 is coupled to the gate and source terminals of a depletion transistor 256, and to the gate terminal of a transistor 258. The drain terminal of the transistor 256 is coupled to the supply voltage terminal 44. The source terminal of the transistor 258 is coupled to ground potential and the drain terminal thereof is coupled to the line 40 ($V_{RG}$) and to one side of a capacitor 260. The second side of the capacitor 260 is coupled to ground potential.

In operation, the $V_{REF}$ modulator circuit 34 modifies operation of the $V_{REF}$ generator 38 as a function of the magnitude of the $V_{BB}$ voltage level. That is, the purpose of the circuit 34 is to ground the $V_{RG}$ voltage level on the line 40 when the substrate is pumped to a sufficiently negative voltage level. The line 40 is grounded when the line 36 is pulled down to the level of the node 224, which occurs when current is being pulled through that leg of the second current mirror including the transistors 230 and 250. The transistor 252 is turned off, which causes the node 254 to rise to the $V_{CC}$ level, thereby turning on the transistor 258. Hence, the line 40 is grounded.

When $V_{RG}$ (line 40) is grounded, this will lower the $V_{REF}$ voltage level by one $V_{TE}$ because the $V_{REF}$ level is derived by stacking one $V_{TE}$ on top of a $V_{TD}$. The $V_{RG}$ voltage level is initially set at one $V_{TE}$, which is a constituent part of the $V_{REF}$ level. If the $V_{RG}$ voltage level is grounded, then the enhancement mode threshold voltage level is eliminated and the $V_{REF}$ voltage level is equal to one $V_{TD}$ voltage level.

The invention has now been explained with respect to specific embodiments. Other embodiments will now be apparent to those of ordinary skill in this art. It is therefore not intended that this invention be limited except as indicated by the appended claims.

We claim:

1. A regulated substrate bias generator for use in a capacitive charge storage integrated circuit memory device formed on a semiconductor substrate and having an external voltage supply, said generator comprising;
   a. means for generating first and second timing signals;
   b. charge pumping means disposed for pumping charge from said substrate in response to said first and second timing signals, and for generating an output bias voltage on an output terminal thereof;
   c. voltage regulation means disposed between said output terminal of said charge pumping means and reference potential input terminals of said means for generating, said voltage regulation means being disposed for providing a reference potential on an output terminal thereof that regulates the amount of charge pumped from said substrate as a function of the magnitude of the generated bias voltage;
   said voltage regulation means including:
   d. voltage clamp circuit means disposed for clamping said generated bias voltage to a limited negative value, said voltage clamp circuit means having an input terminal coupled to the output of said charge pumping means and an output terminal;
   e. a modulator circuit means having an input terminal coupled to said output terminal of said voltage clamp circuit means, and an output terminal; and,
   f. a generator circuit means having an input terminal coupled to said output terminal of said modulator circuit means, and an output terminal coupled to reference voltage input terminals of said means for generating, said generator circuit means being disposed for supplying said reference potential in response to the output of said voltage clamp circuit means as modified by said modulator circuit means.

2. A regulated substrate bias generator as in claim 1 further characterized by said voltage regulation means including an enhancement mode field effect transistor having drain and gate terminals coupled to said output terminal of said charge pumping means and a source terminal coupled to ground potential, a first depletion mode field effect transistor having source and gate terminals coupled to said output terminal of said charge pumping means and a drain terminal coupled to the external voltage supply, and a second depletion mode field effect transistor having a gate terminal coupled to said output terminal of said charge pumping means, a drain terminal coupled to the external supply voltage, and a source terminal coupled to said output terminal of said voltage regulation means, whereby said reference potential is a function of the threshold voltage of said enhancement mode field effect transistor and the absolute value of the threshold voltage of said second depletion mode field effect transistor.

3. A regulated substrate bias generator as in claim 1 further characterized by:
   a. said first and second timing signals being substantially 180° out of phase with one another; and,
   b. said charge pumping means including first and second symmetrical double charge pumps coupled in parallel, each such double pump including first and second stages, with said first stage of said first double charge pump and said second stage of said second double charge pump being operative in response to said first timing signal, and with said second stage of said first double charge pump and said first stage of said second double charge pump being operative in response to said second timing signal.

4. A regulated substrate bias generator as in claim 3 further characterized by the output terminals of each of said symmetrical double charge pumps being coupled together for forming said output terminal of said charge pumping means, whereby the output of said charge pumping means is a full-wave rectified signal.

5. A regulated substrate bias generator for use in a capacitive charge storage integrated circuit memory device formed on a semiconductor substrate and having an external voltage supply, said generator comprising:
   a. circuit means for providing first, second, third, and fourth timing signals;
   b. charge pumping means for pumping charge from the substrate in response to said first, second, third and fourth timing signals, and being disposed for generating an output bias voltage on an output terminal thereof;
   c. voltage regulation means disposed between said output terminal of said charge pumping means and reference potential input terminals of said circuit means, said voltage regulation means being disposed for providing a reference potential to said circuit means that regulates the amount of charge pumped from said substrate as a function of the magnitude of the generated bias voltage;
   said voltage regulation means including:
   d. a voltage clamp circuit means disposed for clamping said generated bias voltage to a limited negative value, said voltage clamp circuit means having an input terminal coupled to the output of said charge pumping means and an output terminal;
   e. modulator circuit means having an input terminal coupled to said output terminal of said voltage clamp circuit means, and an output terminal; and,
   f. a generator circuit having an input terminal coupled to said output terminal of said modulator circuit means, and an output terminal coupled to reference voltage input terminals of said circuit means, said generator circuit means being disposed for supplying said reference potential in response to the output of said voltage clamp circuit means as modified by said modulator circuit means.

6. A regulated substrate bias generator as in claim 5 further characterized by said generator circuit means including an enhancement mode field effect transistor having drain and gate terminals coupled to said input terminal of said generator circuit means and a source terminal coupled to ground potential, a first depletion mode field effect transistor having source and gate terminals coupled to the same input terminal and a drain terminal coupled to the external voltage supply, and a second depletion mode field effect transistor having a gate terminal coupled to the same input terminal, a drain terminal coupled to the external supply voltage and a source terminal coupled to said output terminal of said generator circuit means, whereby said reference potential is a function of the threshold voltage of said enhancement mode field effect transistor and the absolute value of the threshold voltage of said second depletion mode field effect transistor.

7. A regulated substrate bias generator as in claim 5 further characterized by said voltage clamp circuit means including:
   a. a negative voltage level generator means coupled between said external voltage supply and ground potential, and having an input-output terminal coupled to a first circuit node and an output terminal;
   b. a first current mirror means coupled between said output terminal of said charge pumping means and said first circuit node; and,
   c. a second current mirror means having an input-output terminal coupled to said first circuit node, an input terminal coupled to said output terminal of said negative voltage level generator means, and an output terminal coupled to said reference potential input terminals of said circuit means.

8. A regulated substrate bias generator as in claim 5 further characterized by said voltage clamp circuit means including a first depletion mode field effect transistor having a drain terminal coupled to said external voltage supply and gate and source terminals coupled to a first circuit node; a second depletion mode field effect transistor having a drain terminal coupled to said first circuit node, a source terminal coupled to ground potential and a gate terminal coupled to said output terminal of said charge pumping means at a second circuit node; a stack of first, second and third enhancement mode field effect transistors coupled in series between said first and second circuit nodes, each of said enhancement mode field effect transistors having a gate terminal coupled to the drain terminal thereof on the side toward said first circuit node; the connection between said second and third enhancement mode field effect transistors forming said output terminal of said voltage clamp circuit means; and, said second circuit node forming an input-output terminal of said voltage clamp circuit means.

9. A regulated substrate bias generator as in claim 5 further characterized by said modulator circuit means including:
   a. a first enhancement mode field effect transistor having a source terminal coupled to ground potential, a gate terminal coupled to said output terminal of said charge pumping means and a drain terminal coupled to a first circuit node;

b. a depletion mode field effect transistor having gate and source terminal coupled to said first circuit node and a drain terminal coupled to said external voltage supply; and, c. a second enhancement mode field effect transistor having a source terminal coupled to ground potential, a gate terminal coupled to said first circuit node and a drain terminal forming said output terminal of said modulator circuit means.

10. An improved substrate bias generator for use in a capacitive charge storage integrated circuit memory device formed on a semiconductor substrate and having an external voltage supply, said generator comprising:

a. oscillator means for generating a first timing signal in response to the external supply voltage;

b. first inverter-buffer means disposed for providing second, third and fourth timing signals in response to said first timing signal;

c. second inverter-buffer means disposed for providing fifth and sixth timing signals in response to said second timing signal;

d. charge pumping means disposed for pumping charge from the substrate of the integrated circuit digital memory device in response to said third, fourth, fifth and sixth timing signals, and for generating an output bias voltage on an output terminal thereof; and, e. voltage regulation means disposed between the output of said charge pumping means and said first and second inverter-buffer means for providing a regulating reference potential to said first and second inverter-buffer means that regulates the amount of charge pumped from said substrate as a function of the magnitude of the generated bias voltage.

11. An improved substrate bias generator as in claim 10 further characterized by:

a. said third and fourth timing signals being substantially in phase with one another;

b. said fifth and sixth timing signals being substantially in phase with one another but substantially 180° out of phase with said third and fourth timing signals; and, c. said charge pumping means including first and second symmetrical double charge pumps coupled in parallel, each such double charge pump including first and second stages, with said first stage of said first double charge pump being operative in response to said third timing signal, said first stage of said second double charge pump being operative in response to said fifth timing signal, said second stage of said first double charge pump being operative in response to said fifth and sixth timing signals, and said second stage of said second double charge pump being operative in response to said third and fourth timing signals.

12. An improved substrate bias generator as in claim 11 further characterized by the output terminals of each of said symmetrical double charge pumps being coupled together for forming said output terminal of said charge pumping means, whereby the output of said charge pumping means is a full-wave rectified signal.

13. An improved substrate bias generator as in claim 10 further characterized by said voltage regulation means including:

a. a voltage clamp circuit means disposed for clamping said generated bias voltage to a limited negative value, said voltage clamp circuit means having an input terminal coupled to the output of said charge pumping means and an output terminal;

b. a modulator circuit means having an input terminal coupled to said output terminal of said voltage clamp circuit means, and an output terminal; and, c. a generator circuit means having an input terminal coupled to said output terminal of said modulator circuit means, and an output terminal coupled to reference voltage input terminals of said first and second inverter-buffer means, said generator circuit means being disposed for supplying said reference potential in response to the output of said voltage clamp circuit means as modified by said modulator circuit means.

14. An improved substrate bias generator as in claim 13 further characterized by said generator circuit means including an enhancement mode field effect transistor having drain and gate terminals coupled to said input terminal of said generator circuit means and a source terminal coupled to ground potential, a first depletion mode field effect transistor having source and gate terminals coupled to the same input terminal and a drain terminal coupled to the external voltage supply, and a second depletion mode field effect transistor having a gate terminal coupled to the same input terminal, a drain terminal coupled to the external supply voltage and a source terminal coupled to said output terminal of said generator circuit means, whereby said reference potential is a function of the threshold voltage of said enhancement mode field effect transistor and the absolute value of the threshold voltage of said second depletion mode field effect transistor.

15. An improved substrate bias generator as in claim 13 further characterized by said voltage clamp circuit means including:

a. a negative voltage level generator means coupled between said external voltage supply and ground potential, and having an input-output terminal coupled to a first circuit node and an output terminal;

b. a first current mirror means coupled between said output terminal of said charge pumping means and said first circuit node; and, c. a second current mirror means having an input-output terminal coupled to said first circuit node, an input terminal coupled to said output terminal of said negative voltage level generator means, and an output terminal coupled to said reference potential input terminals of said circuit means.

16. An improved substrate bias generator as in claim 13 further characterized by said voltage clamp circuit means including a first depletion mode field effect transistor having a drain terminal coupled to said external voltage supply and gate and source terminals coupled to a first circuit node; a second depletion mode field effect transistor having a drain terminal coupled to said first circuit node, a source terminal coupled to ground potential and a gate terminal coupled to said output terminal of said charge pumping means at a second circuit node; a stack of first, second and third enhancement mode field effect transistors coupled in series between said first and second circuit nodes, each of said enhancement mode field effect transistors having a gate terminal coupled to the drain terminal thereof on the side toward said first circuit node; the connection between said second and third enhancement mode field effect transistors forming said output terminal of said voltage clamp circuit means; and, said second circuit node forming an input-output terminal of said voltage clamp circuit means.

17. An improved substrate bias generator as in claim 13 further characterized by said modulator circuit means including:
a. a first enhancement mode field effect transistor having a source terminal coupled to ground potential, a gate terminal coupled to said output terminal of said charge pumping means and a drain terminal coupled to a first circuit node;
b. a depletion mode field effect transistor having gate and source terminal coupled to said first circuit node and a drain terminal coupled to said external voltage supply; and,
c. a second enhancement mode field effect transistor having a source terminal coupled to ground potential, a gate terminal coupled to said first circuit node and a drain terminal forming said output terminal of said modulator circuit means.

* * * * *